(12) United States Patent
Du et al.

(10) Patent No.: US 10,355,141 B1
(45) Date of Patent: Jul. 16, 2019

(54) SENSING ELEMENT AND SENSING DISPLAY PANEL

(71) Applicant: Au Optronics Corporation, Hsinchu (TW)

(72) Inventors: Jia-Hao Du, Kaohsiung (TW); Kuo-Jui Chang, Hsinchu County (TW); Hong-Yang Chuang, New Taipei (TW); Kai-Chung Cheng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/950,182

(22) Filed: Apr. 11, 2018

(30) Foreign Application Priority Data

Jan. 15, 2018 (TW) .............................. 107101459 A

(51) Int. Cl.
| | | |
|---|---|---|
| *H01L 29/84* | (2006.01) | |
| *H01L 29/786* | (2006.01) | |
| *H01L 27/12* | (2006.01) | |
| *H01L 27/15* | (2006.01) | |
| *H01L 27/32* | (2006.01) | |
| *H01L 29/08* | (2006.01) | |
| *G06F 3/044* | (2006.01) | |

(52) U.S. Cl.
CPC ............ *H01L 29/84* (2013.01); *H01L 27/124* (2013.01); *H01L 27/1255* (2013.01); *H01L 27/156* (2013.01); *H01L 27/323* (2013.01); *H01L 27/3262* (2013.01); *H01L 27/3265* (2013.01); *H01L 27/3276* (2013.01); *H01L 29/0847* (2013.01); *H01L 29/78618* (2013.01); *H01L 29/78696* (2013.01); *G06F 3/044* (2013.01); *G06F 2203/04102* (2013.01); *H01L 29/7869* (2013.01); *H01L 29/78675* (2013.01)

(58) Field of Classification Search
CPC ............... H01L 27/1222; H01L 27/124; H01L 27/3225; H01L 27/323
See application file for complete search history.

(56) References Cited

U.S. PATENT DOCUMENTS

| | | |
|---|---|---|
| 2009/0237369 A1 | 9/2009 | Hur et al. |
| 2012/0287075 A1 | 11/2012 | Tai et al. |

(Continued)

FOREIGN PATENT DOCUMENTS

TW 201246027 11/2012

*Primary Examiner* — Bryan R Junge
(74) *Attorney, Agent, or Firm* — JCIPRNET

(57) ABSTRACT

A sensing element is provided. The sensing element includes an active layer, a first source, a second source, a drain, and a gate. The active layer is disposed on a substrate, wherein the active layer includes a first source region, a second source region, a drain region, and a channel region. The first source is electrically connected to the first source region. The second source is electrically connected to the second source region. The drain is electrically connected to the drain region. The gate is overlapped with the channel region in a normal direction of the substrate, wherein the first source is extended toward the channel region in a first direction, the second source is extended toward the channel region in a second direction, the first direction and the second direction are intersected with the normal direction, and an angle between the first direction and the second direction is not equal to 180 degrees.

9 Claims, 7 Drawing Sheets

(56) References Cited

U.S. PATENT DOCUMENTS

| | | | | |
|---|---|---|---|---|
| 2016/0299530 A1* | 10/2016 | Zhang | ................... | G06F 3/041 |
| 2017/0316738 A1* | 11/2017 | Sohn | ................... | G09G 3/3225 |
| 2018/0061994 A1* | 3/2018 | Shi | ....................... | H01L 29/36 |
| 2019/0057982 A1* | 2/2019 | Hwang | ............... | H01L 27/1214 |

* cited by examiner

SENSING ELEMENT AND SENSING DISPLAY PANEL

CROSS-REFERENCE TO RELATED APPLICATION

This application claims the priority benefit of Taiwan application serial no. 107101459, filed on Jan. 15, 2018. The entirety of the above-mentioned patent application is hereby incorporated by reference herein and made a part of this specification.

BACKGROUND OF THE INVENTION

Field of the Invention

The invention relates to a semiconductor device and a display panel, and more particularly, to a sensing element and a sensing display panel.

Description of Related Art

Currently, an on-cell sensing display requires a sensing element to be disposed on the outside of the display for a sensing operation, and therefore the drawbacks of poor product yield and significant increase in manufacturing cost occur as screen size is gradually increased. In view of an in-cell sensing display, the sensing element can be directly embedded on the array substrate in the display to produce the in-cell sensing display using existing production capacity and photomask adjustment process without additional investment in large capital expenditure, and therefore bonding and assembly cost can be reduced, and the thickness and weight of the device can be reduced to obtain advantages such as high yield, low cost, and lack of size restrictions.

SUMMARY OF THE INVENTION

At least one embodiment of the invention provides a sensing element having increased sensitivity and can sense deformation in a plurality of directions.

At least one embodiment of the invention provides a sensing display panel suitable for a touch sensing application and a bend sensing application, having increased sensitivity and can sense deformation in a plurality of directions.

The sensing element of an embodiment of the invention includes an active layer, a first source, a second source, a drain, and a gate. The active layer is disposed on a substrate, wherein the active layer includes a first source region, a second source region, a drain region, and a channel region. The first source is electrically connected to the first source region. The second source is electrically connected to the second source region. The drain is electrically connected to the drain region. The gate is overlapped with the channel region in a normal direction of the substrate, wherein the first source is extended toward the channel region in a first direction, the second source is extended toward the channel region in a second direction, the first direction and the second direction are intersected with the normal direction, and an angle between the first direction and the second direction is not equal to 180 degrees.

The sensing display panel of an embodiment of the invention includes at least one pixel unit, and the pixel unit includes a first scan line, a data line, a first sensing line, a second sensing line, a switch element, a driving element, and a sensing element. The first scan line, the data line, the first sensing line, and the second sensing line are disposed on a substrate. The switch element is electrically connected to the first scan line and the data line. The driving element is electrically connected to the switch element. The sensing element is electrically connected to the driving element, the first sensing line, and the second sensing line, and the sensing element includes an active layer, a first source, a second source, a drain, and a gate. The active layer is disposed on a substrate, wherein the active layer includes a first source region, a second source region, a drain region, and a channel region. The first source is electrically connected to the first source region. The second source is electrically connected to the second source region. The drain is electrically connected to the drain region. The gate is overlapped with the channel region in a normal direction of the substrate, wherein the first source is extended toward the channel region in a first direction, the second source is extended toward the channel region in a second direction, the first direction and the second direction are intersected with the normal direction, and an angle between the first direction and the second direction is not equal to 180 degrees.

Based on the above, in the sensing display panel of an embodiment of the invention, because the pixel unit includes the switch element electrically connected to the first scan line and the data line, the driving element electrically connected to the switch element, and the sensing element electrically connected to the driving element, the first sensing line, and the second sensing line, wherein the sensing element includes the active layer, the first source, the second source, the drain, and the gate, the active layer includes the first source region electrically connected to the first source, the second source region electrically connected to the second source, the drain region electrically connected to the drain, and the channel region, the first drain is extended toward the channel region in the first direction, the second source is extended toward the channel region in the second direction, the first direction and the second direction are intersected with the normal direction of the substrate, and the angle not equal to 180 degrees is between the first direction and the second direction, two currents with different paths pass through the sensing element, and thereby the sensing display panel has increased carrier collection rate. As a result, when the sensing display panel is applied in touch sensing and bend sensing, the sensing display panel have increased sensitivity, and when the sensing display panel is applied in bend sensing, the sensing display panel perform a sensing operation on the bending in a plurality of directions (such as the first direction and the second direction) via the current variation generated by the deformation of the sensing element.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the present specification, for ease of understanding, the locations of the source and the drain of the transistors in the figures are exemplary, and the invention is not limited thereto.

Moreover, it should be understood that, when an element of, for instance, a layer, film, region, or substrate is described as "on" another element or "in contact" with another element, the element can be directly on the other element or in direct contact with the other element, or a middle element is present between the element and the other element. On the other hand, when an element is described as "directly on another element" or "in direct contact" with another element, a middle element is not present between the element and the other element.

"Electrically connected" in the present specification can refer to two or a plurality of elements in direct physical contact with or electrically connected to one another, or indirectly in physical contact with or electrically connected to one another, and examples of indirect physical contact or electrical connection include two elements in physical contact with or electrically connected to each other with a middle element in between, and the middle element can be a switch (such as a thin-film transistor) or an element such as a resistor or a capacitor, and "electrically connected" can further indicate two or more elements operating or acting with one another.

Figure 1:
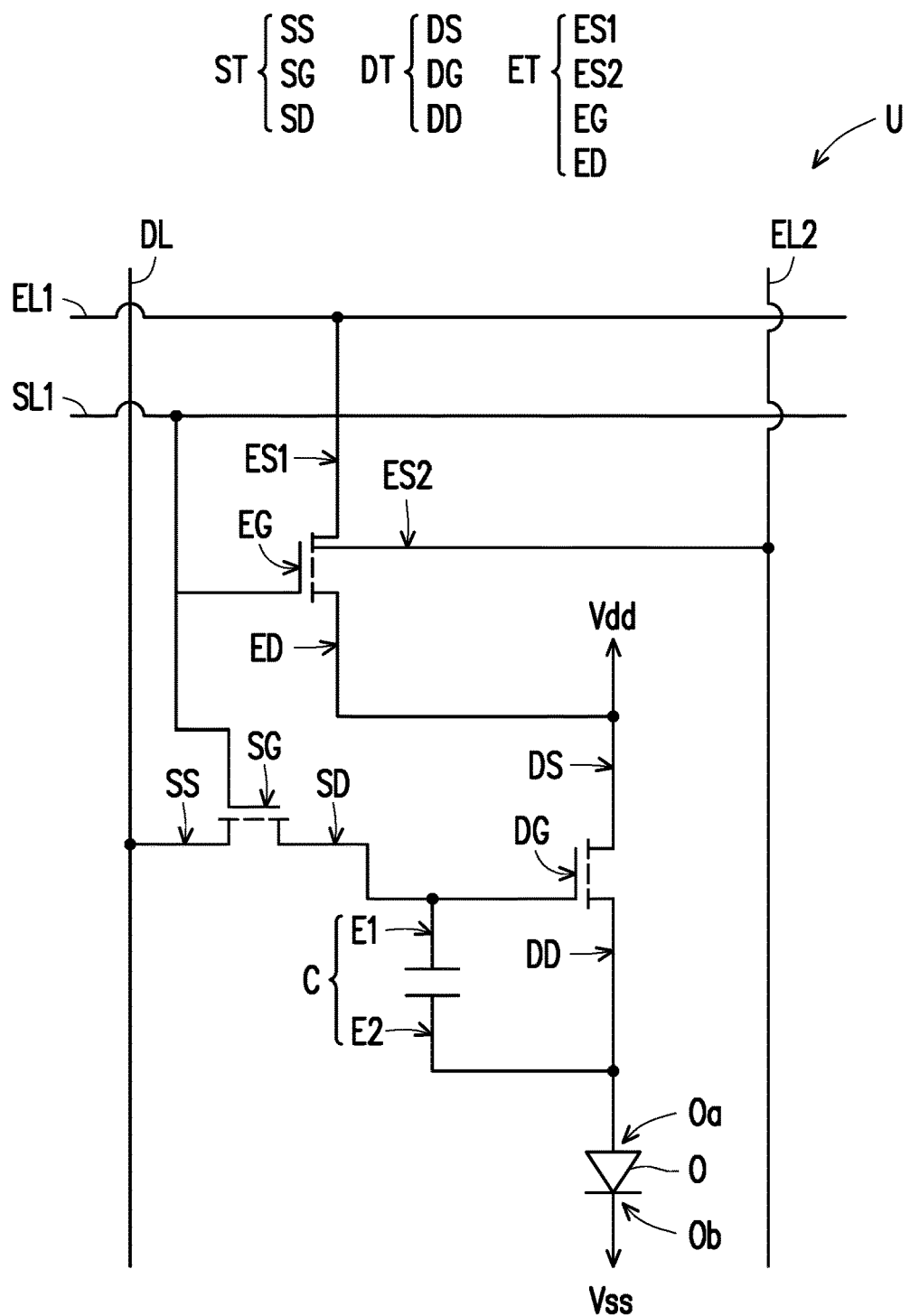
FIG. 1 is a partial equivalent circuit diagram of a sensing display panel according to an embodiment of the invention.
Figure 2:
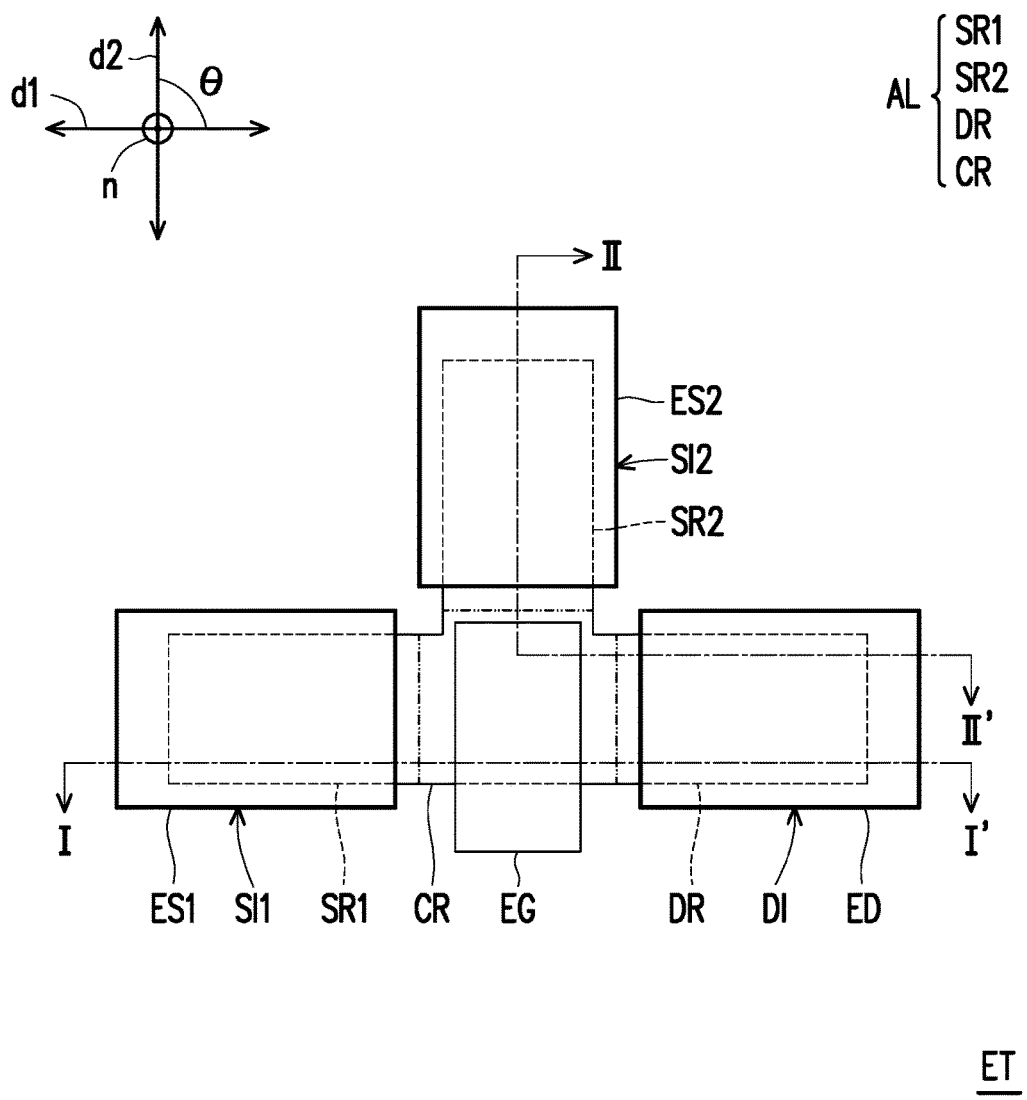
FIG. 2 is a top view of the sensing element in FIG. 1.
Figure 3:
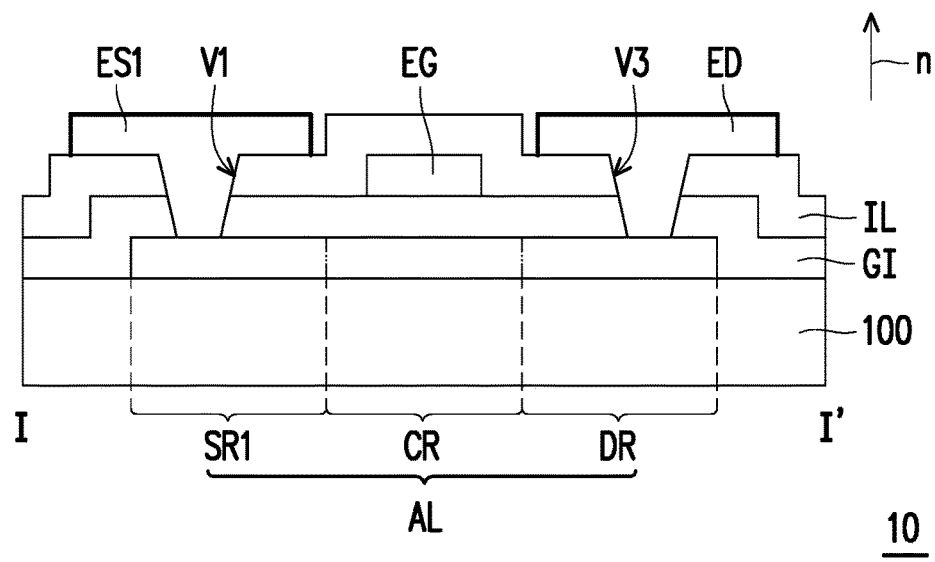
FIG. 3 is a partial cross section of the sensing display panel of FIG. 1, wherein the location of the cross section corresponds to the location of section line I-I' in FIG. 2.
Figure 4:
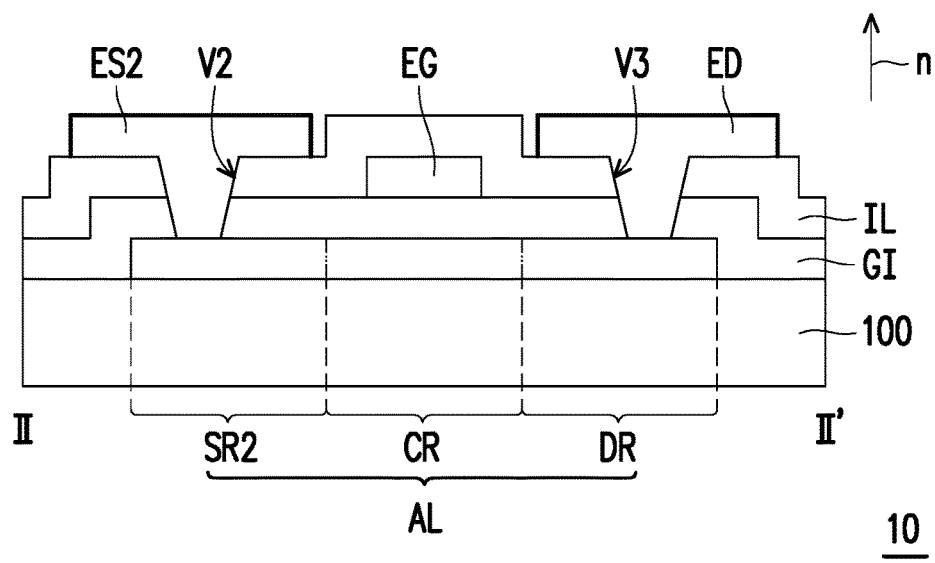
FIG. 4 is a partial cross section of the sensing display panel of FIG. 1, wherein the location of the cross section corresponds to the location of section line II-IF in FIG. 2.

FIG. 1 is a partial equivalent circuit diagram of a sensing display panel according to an embodiment of the invention. FIG. 2 is a top view of the sensing element in FIG. 1. FIG. 3 is a partial cross section of the sensing display panel of FIG. 1. FIG. 4 is a partial cross section of the sensing display panel of FIG. 1. It should be mentioned that, the location of the cross section of FIG. 3 can correspond to the location of section line I-I' in FIG. 2, and the location of the cross section of FIG. 4 can correspond to the location of section line II-II' in FIG. 2.

Figure 9:
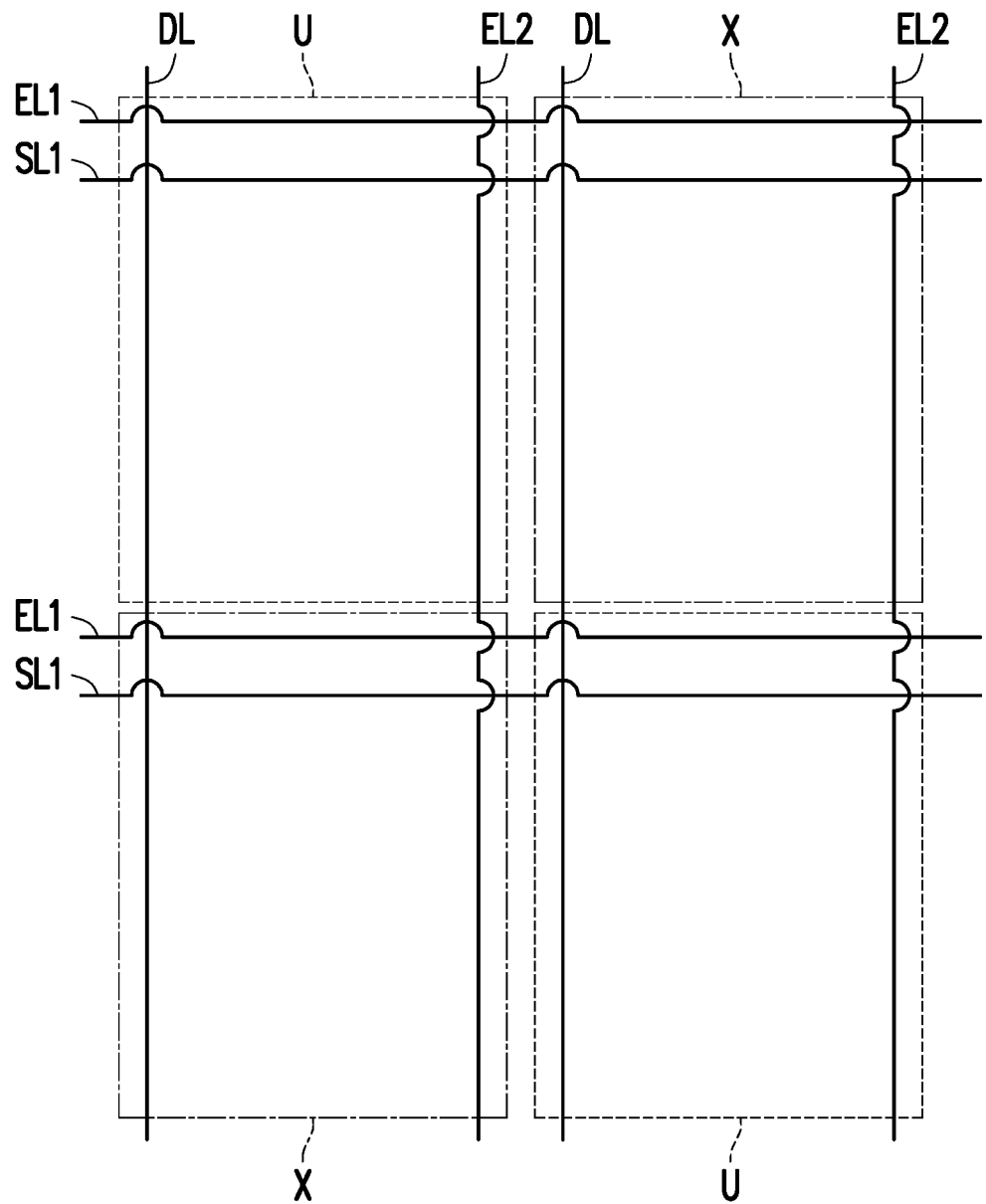
FIG. 9 is a partial view of a sensing display panel according to another embodiment of the invention.

Referring to all of FIG. 1 to FIG. 4, a sensing display panel 10 includes a substrate 100 and a pixel unit U disposed on the substrate 100, wherein the pixel unit U includes a first scan line SL1, a data line DL, a first sensing line EL1, a second sensing line EL2, a switch element ST, a driving element DT, and a sensing element ET. Moreover, the pixel unit U optionally further includes a capacitor C and a light-emitting element O. It should be mentioned that, for clarity, FIG. 1 only shows a single pixel unit U, but those having ordinary skill in the art of the invention should understand that, the sensing display panel 10 actually includes a plurality of pixel units U which may be arranged in an array. However, the invention is not limited thereto. In other embodiments, the sensing display panel 10 can include at least one pixel unit U and a plurality of other pixel units X different from the pixel unit U, as shown in FIG. 9. In an embodiment, the other pixel units X may not contain the light-emitting element O, and therefore these other pixel units X do not have display function. In another embodiment, the other pixel units X can contain the light-emitting element O but not contain the sensing element ET, and therefore these other pixel units X have display function but do not have sensing function. In yet another embodiment, the other pixel units X may not contain the light-emitting element O but contain the sensing element ET, and therefore these other pixel units X only have sensing function and do not have display function. In yet another embodiment, the other pixel units X may not contain the light-emitting element O and the sensing element ET, but contain an element providing the other pixel units X with fingerprint recognition function. In yet another embodiment, the other pixel units X may not contain the light-emitting element O and the sensing element ET, but contain an element providing the other pixel units X with pressure sensing function. From another perspective, in the present embodiment, the sensing display panel 10 is an embedded sensing display panel.

In the present embodiment, the material of the substrate 100 may be glass, quartz, or an organic polymer.

In the present embodiment, the switch element ST may be any thin-film transistor known to those having ordinary skill in the art of the invention such as a bottom-gate thin-film transistor or a top-gate thin-film transistor. In the present embodiment, a gate SG of the switch element ST is electrically connected to the first scan line SL1, a source SS of the switch element ST is electrically connected to the data line DL, and a drain SD of the switch element ST is electrically connected to an electrode $E_1$ of the capacitor C and the driving element DT.

In the present embodiment, the driving element DT may be any thin-film transistor known to those having ordinary skill in the art of the invention such as a bottom-gate thin-film transistor or a top-gate thin-film transistor. In the present embodiment, a gate DG of the driving element DT is electrically connected to the drain SD of the switch element ST and the electrode $E_1$ of the capacitor C, a drain DD of the driving element DT is electrically connected to the light-emitting element O, and a source DS of the driving element DT is electrically connected to a voltage source Vdd.

In the present embodiment, the light-emitting element O may be any light-emitting element known to those having ordinary skill in the art of the invention such as an organic light-emitting diode (OLED) or a micro light-emitting diode (μLED). In the present embodiment, an anode Oa of the light-emitting element O is electrically connected to the drain DD of the driving element DT and an electrode $E_2$ of the capacitor C, and a cathode Ob of the light-emitting element O is electrically connected to a voltage source Vss, but the invention is not limited thereto. The voltage of the voltage source Vdd is different from the voltage of the voltage source Vss. In the present embodiment, the light-emitting element O is driven by the switch element ST, the driving element DT, and the capacitor C, that is, the pixel unit U has a two-transistor-one-capacitor (2T1C) architecture. However, the invention is not limited thereto. In other embodiments, the pixel unit U may also have a one-transistor-one-capacitor (1T1C) architecture, a three-transistorone-capacitor (3T1C) architecture, a three-transistor-two-capacitor (3T2C) architecture, a four-transistor-one-capacitor (4T1C) architecture, a four-transistor-two-capacitor (4T2C) architecture, a five-transistor-one-capacitor (5T1C) architecture, a five-transistor-two-capacitor (5T2C) architecture, a six-transistor-one-capacitor (6T1C) architecture, a six-transistor-two-capacitor (6T2C) architecture, a seven-transistor-two-capacitor (7T2C) architecture, or any possible architecture.

In the present embodiment, as shown in FIG. 2 to FIG. 4, the sensing element ET includes an active layer AL, a first source ES1, a second source ES2, a drain ED, and a gate EG. In other words, in the present embodiment, the sensing element ET is a dual source thin-film transistor. The current passing through the transistor is formed by the movement of a carrier from the source terminal to the drain terminal. Accordingly, via a dual source design, the sensing element ET may allow two currents to pass through. As a result, the carrier collection rate of the sensing element ET is increased, and thus increased sensitivity is achieved.

In the present embodiment, the active layer AL includes a first source region SR1, a second source region SR2, a drain region DR, and a channel region CR. In the present embodiment, the channel region CR is located between the first source region SR1, the second source region SR2, and the drain region DR, and the first source region SR1 and the drain region DR are disposed opposite to each other at two sides of the channel region CR of the active layer AL. As shown in FIG. 2, in the present embodiment, the contour of the active layer AL is T-shaped. Moreover, the material of the active layer AL may include polysilicon or a metal-oxide-semiconductor material, and the metal-oxide-semiconductor material is, for instance, indium-gallium-zinc oxide (IGZO), zinc oxide (ZnO), tin oxide (SnO), indium-zinc oxide (IZO), gallium-zinc oxide (GZO), zinc-tin oxide (ZTO), or indium-tin oxide (ITO).

In the present embodiment, the gate EG and the channel region CR of the active layer AL are overlapped in a normal direction n of the substrate 100. In the present embodiment, the gate EG is located above the channel region CR. In other words, in the present embodiment, the sensing element ET is a top-gate thin-film transistor. Moreover, based on conductivity considerations, the gate EG may adopt a metal material, but the invention is not limited thereto. In other embodiments, the gate EG may also adopt other conductive materials such as an alloy, nitride of a metal material, oxide of a metal material, oxynitride of a metal material, or stacked layers of a metal material and other conductive materials.

In the present embodiment, as shown in FIG. 3 and FIG. 4, the sensing display panel 10 further includes a gate insulation layer GI disposed between the gate EG and the channel region CR of the active layer AL. In the present embodiment, the gate insulation layer GI is located on the channel region CR, and the gate EG is located on the gate insulation layer GI. Moreover, as shown in FIG. 3 and FIG. 4, the sensing display panel 10 further includes an interlayer insulation layer IL covering the gate EG. In the present embodiment, the gate insulation layer GI and the interlayer insulation layer IL may be entirely formed on the substrate 100. The material of the gate insulation layer GI and the interlayer insulation layer IL may be, for instance, an inorganic material, organic material, or a combination thereof, wherein the inorganic material is, for instance: silicon oxide, silicon nitride, silicon oxynitride, or stacked layers of at least two of the materials above; and the organic material is, for instance, a polymer material such as polyimide resin, epoxy resin, or acrylic resin. Moreover, in the present embodiment, the gate insulation layer GI is single film layer and the interlayer insulation layer IL is single film layer, but the invention is not limited thereto. In other embodiments, the gate insulation layer GI may also be formed by stacking a plurality of film layers and the interlayer insulation layer IL may also be formed by stacking a plurality of film layers.

In the present embodiment, as shown in FIG. 3 and FIG. 4, the first source ES1 is electrically connected to the first source region SR1 of the active layer AL via a first contact window V1, the second source ES2 is electrically connected to the second source region SR2 of the active layer AL via a second contact window V2, and the drain ED is electrically connected to the drain region DR of the active layer AL via a third contact window V3. In the present embodiment, the first contact window V1, the second contact window V2, and the third contact window V3 are formed in the gate insulation layer GI and the interlayer insulation layer IL. As described above, in the present embodiment, the first source region SR1 and the drain region DR are disposed opposite to each other at two sides of the channel region CR, and the first source ES1 and the drain ED are disposed opposite to each other at two sides of the channel region CR. Moreover, based on conductivity considerations, the first source ES1, the second source ES2, and the drain ED may adopt a metal material, but the invention is not limited thereto. In other embodiments, the first source ES1, the second source ES2, and the drain ED may also adopt other conductive materials such as an alloy, nitride of a metal material, oxide of a metal material, oxynitride of a metal material, or stacked layers of a metal material and other conductive materials.

In the present embodiment, as shown in FIG. 2, the first source ES1 is extended toward the channel region CR in a first direction d1, and the second source ES2 is extended toward the channel region CR in a second direction d2, wherein the first direction d1 and the second direction d2 are perpendicular to the normal direction n of the substrate 100. The first source ES1 is extended toward the channel region CR in the extending direction of the long side S11 of the first source ES1, and the long side S11 is greater than the short side of the first source ES1. The second source ES2 is extended toward the channel region CR in the extending direction of the long side S12 of the second source ES2, and the long side S12 is greater than the short side of the second source ES2. In the present embodiment, the long side S11 of the first source ES1 is parallel to the first direction d1, and the long side S12 of the second source ES2 is parallel to the second direction d2. Moreover, in the present embodiment, an angle θ between the first direction d1 and the second direction d2 is 90 degrees. In other words, in the present embodiment, the extending direction of the first source ES1 and the extending directions of the second source ES2 are substantially perpendicular. Moreover, in the present embodiment, the drain ED disposed opposite to the first source ES1 is also extended toward the channel region CR in the first direction d1. The drain ED is extended toward the channel region CR in the extending direction of the long side D1 of the drain ED, and the long side D1 is greater than the short side of the drain ED. In other words, in the present embodiment, a long side D1 of the drain ED is parallel to the first direction d1. As observed along the normal direction n, the drain ED and the second source ES2 are not located on the same horizontal line, while the first source ES1 and the drain ED are, for instance, located on the same horizontal line.

As described above, a current is formed when carriers are moved from the source terminal to the drain terminal, and therefore when the angle θ between the first direction d1 and the second direction d2 is 90 degrees, the current path between the first source ES1 and the drain ED is different from the current path between the second source ES2 and the drain ED. In the present embodiment, the current path between the first source ES1 and the drain ED is parallel to the first direction d1, and the current path between the second source ES2 and the drain ED is parallel to the second direction d2.

In the present embodiment, the sensing display panel 10 performs a sensing operation by generating current variation from the deformation of the sensing element ET. In the present specification, the current variation is defined as the ratio of the difference between the current value after deformation and the current value before deformation to the current value before deformation. As a result, since the current path between the first source ES1 and the drain ED is parallel to the first direction d1 and the current path between the second source ES2 and the drain ED is parallel to the second direction d2, when the sensing display panel 10 is applied in bend sensing, the sensing display panel 10 may sense any deformation caused by the bending in the first direction d1 and the second direction d2 more accurately. When the sensing display panel 10 is bent along the first direction d1 (i.e., horizontal bending), significant current variation is formed between the first source ES1 and the drain ED due to the deformation; and when the sensing display panel 10 is bent along the second direction d2 (i.e., vertical bending), significant current variation is formed between the second source ES2 and the drain ED due to the deformation.

Moreover, as described above, due to the design of a dual source sensing element ET (including the first source ES1 and the second source ES2), when the sensing display panel 10 is bent along the first direction d1, although the current variation between the second source ES2 and the drain ED is not significant, the sensing element ET with two currents passing through has increased carrier collection rate and therefore increased sensitivity. Accordingly, the situation in which the sensing display panel 10 is bent along the second direction d2 may be extrapolated from the above.

In the present embodiment, referring to both FIG. 1 and FIG. 2, the first source ES1 of the sensing element ET is electrically connected to a first sensing line EL1, the second source ES2 of the sensing element ET is electrically connected to a second sensing line EL2, the drain ED of the sensing element ET is electrically connected to the source DS of the driving element DT and the voltage source Vdd, and the gate EG of the sensing element ET is electrically connected to the first scan line SL1 and the gate SG of the switch element ST. In other words, in the present embodiment, the sensing element ET is electrically connected to the first sensing line EL1, the second sensing line EL2, the driving element DT, and the switch element ST.

In the present embodiment, since the pixel unit U includes the switch element ST, the driving element DT, and the sensing element ET, wherein the sensing element ET includes the active layer AL, the first source ES1, the second source ES2, the drain ED, and the gate EG, two currents pass through the sensing element ET, and thereby the sensing display panel 10 may have increased carrier collection rate. As a result, when the sensing display panel 10 is applied in touch sensing and bend sensing, the sensing display panel 10 may have increased sensitivity.

Furthermore, in the present embodiment, the first source ES1 of the sensing element ET is extended toward the channel region CR in the first direction d1, and the second source ES2 is extended toward the channel region CR in the second direction d2, wherein the first direction d1 and the second direction d2 are intersected with the normal direction n and the angle θ not equal to 180 degrees is between the first direction d1 and the second direction d2, and therefore the current path between the first source ES1 and the drain ED is different from the current path between the second source ES2 and the drain ED. As a result, when the sensing display panel 10 is applied in bend sensing, the sensing display panel 10 may perform a sensing operation on the bending in a plurality of different directions (such as the first direction d1 and the second direction d2) via the current variation generated from the deformation of the sensing element ET.

Moreover, based on the above, to allow the sensing display panel 10 to sense the deformation in the first direction d1 and the second direction d2, those having ordinary skill in the art of the invention may understand that, the angle θ between the first direction d1 and the second direction d2 is not limited to 90 degrees, as long as the angle θ is not equal to 180 degrees. In other words, in other embodiments, in the case that the angle between the first direction d1 and the second direction d2 is not equal to 180 degrees, the angle may be not equal to 90 degrees. In the following, other embodiments are described with reference to FIG. 5. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 5:
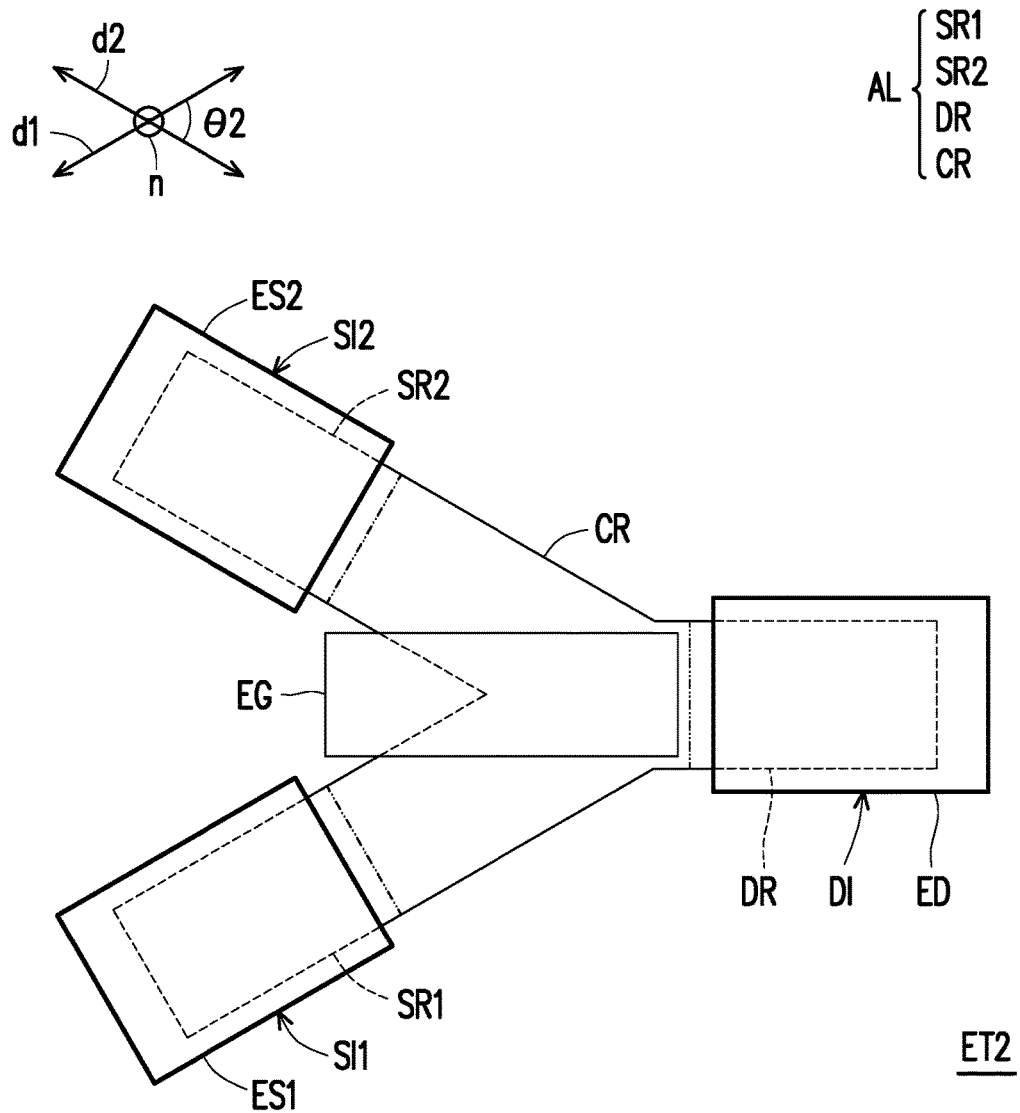
FIG. 5 is a top view of a sensing element according to another embodiment of the invention.

FIG. 5 is a top view of a sensing element according to another embodiment of the invention. Referring to both FIG. 5 and FIG. 2, a sensing element ET2 of FIG. 5 is similar to the sensing element ET of FIG. 2, and therefore the same or similar elements are represented by the same or similar reference numerals, and the same technical content is omitted. Descriptions of the omitted portions are provided in the above embodiments. In the following, the differences between the two are described.

Referring to FIG. 5, in the present embodiment, the contour of the active layer AL is Y-shaped. In the present embodiment, the first source region SR1, the second source region SR2, and the drain region DR are respectively located on three terminals of the active layer AL, and therefore the first source ES1, the second source ES2 and the drain ED are at the locations respectively and corresponding to the above mentioned three terminals of the active layer AL.

In the present embodiment, an angle θ2 between the first direction d1 and the second direction d2 is not equal to 180 degrees and also not equal to 90 degrees. In the present embodiment, the angle θ2 may be 60 degrees to 120 degrees. In other words, in the present embodiment, as observed along the normal direction n, the first source ES1 and the second source ES2 are not located on the same horizontal line.

As described above, a current is formed when carriers are moved from the source terminal to the drain terminal, and therefore when the angle θ2 between the first direction d1 and the second direction d2 is not equal to 180 degrees and not equal to 90 degrees, the current path between the first source ES1 and the drain ED is different from the current path between the second source ES2 and the drain ED. In the present embodiment, the current path between the first source ES1 and the drain ED is parallel to the first direction d1, and the current path between the second source ES2 and the drain ED is parallel to the second direction d2. As a result, since the current path between the first source ES1 and the drain ED is parallel to the first direction d1 and the current path between the second source ES2 and the drain ED is parallel to the second direction d2, when the sensing display panel including the sensing element ET2 is applied in bend sensing, the sensing display panel may sense any deformation caused by the bending in the first direction d1 and the second direction d2 more accurately. When the sensing display panel including the sensing element ET2 is bent along the first direction d1, significant current variation is generated between the first source ES1 and the drain ED due to deformation; and when the sensing display panel including the sensing element ET2 is bent along the second direction d2, significant current variation is generated between the second source ES2 and the drain ED due to deformation.

Moreover, due to the design of a dual source sensing element ET2 (including the first source ES1 and the second source ES2), when the sensing display panel including the sensing element ET2 is bent along the first direction d1, although the current variation between the second source ES2 and the drain ED is not significant, the sensing element ET2 with two currents passing through has increased carrier collection rate and therefore increased sensitivity. Accordingly, the situation in which the bending along the second direction d2 includes the sensing display panel of the sensing element ET2 may be extrapolated from the above.

Moreover, in the embodiments of FIG. 1 to FIG. 4, the sensing element ET is a top-gate thin-film transistor, but the invention is not limited thereto. In other embodiments, the sensing element ET may be any type of transistor known to those having ordinary skill in the art of the invention, such as a bottom-gate thin-film transistor. In the following, other embodiments are described with reference to FIG. 6 and FIG. 7. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 6:
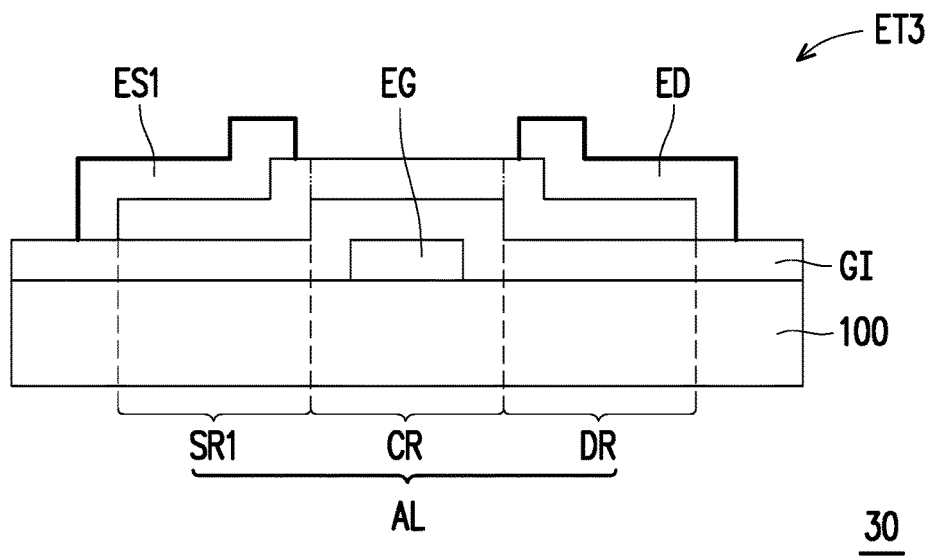
FIG. 6 is a partial cross section of a sensing display panel according to another embodiment of the invention.
Figure 7:
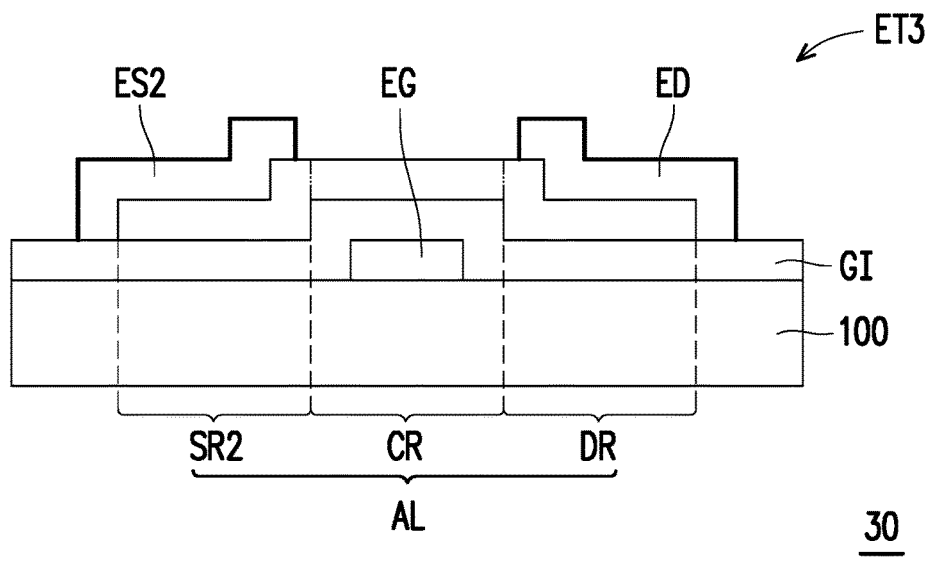
FIG. 7 is a partial cross section of a sensing display panel according to another embodiment of the invention.

FIG. 6 is a partial cross section of a sensing display panel according to another embodiment of the invention. FIG. 7 is a partial cross section of a sensing display panel according to another embodiment of the invention. It should be mentioned that, the location of the cross section of FIG. 6 is as provided for the location of section line I-I' in FIG. 2, and the location of the cross section of FIG. 7 is as provided for the location of section line II-II' in FIG. 2. Moreover, referring to all of FIGS. 6 to 7 and FIGS. 3 to 4, a sensing display panel 30 of FIGS. 6 to 7 is similar to the sensing display panel 10 of FIGS. 3 to 4, and therefore the same or similar elements are represented by the same or similar reference numerals, and the same technical content is omitted. Descriptions of the omitted portions are provided in the above embodiments. In the following, the differences between the two are described.

Referring to both FIG. 6 and FIG. 7, in the sensing display panel 30 of the present embodiment, a gate EG is located below a channel region CR of an active layer AL, and a gate insulation layer GI covers the gate EG. In other words, a sensing element ET3 in the sensing display panel 30 is a bottom-gate thin-film transistor. In the present embodiment, the material of the active layer AL may include amorphous silicon. Moreover, in the present embodiment, a first source ES1 is in direct contact with and electrically connected to a first source region SR1 of the active layer AL, a second source ES2 is in direct contact with and electrically connected to a second source region SR2 of the active layer AL, and a drain ED is in direct contact with and electrically connected to a drain region DR of the active layer AL.

Moreover, in the embodiment of FIG. 1, the gate EG of the sensing element ET and the gate SG of the switch element ST are electrically connected to the same scan line (i.e., the first scan line SL1), but the invention is not limited thereto. In other embodiments, the gate EG of the sensing element ET and the gate SG of the switch element ST may also be electrically connected to different scan lines. In the following, other embodiments are described with reference to FIG. 8. It should be mentioned here that, the embodiments below adopt the reference numerals of the embodiments above and a portion of the content thereof, wherein the same or similar reference numerals are used to represent the same or similar devices and descriptions of the same technical content are omitted. The omitted portions are described in the previous embodiments and are not repeated in the following embodiments.

Figure 8:
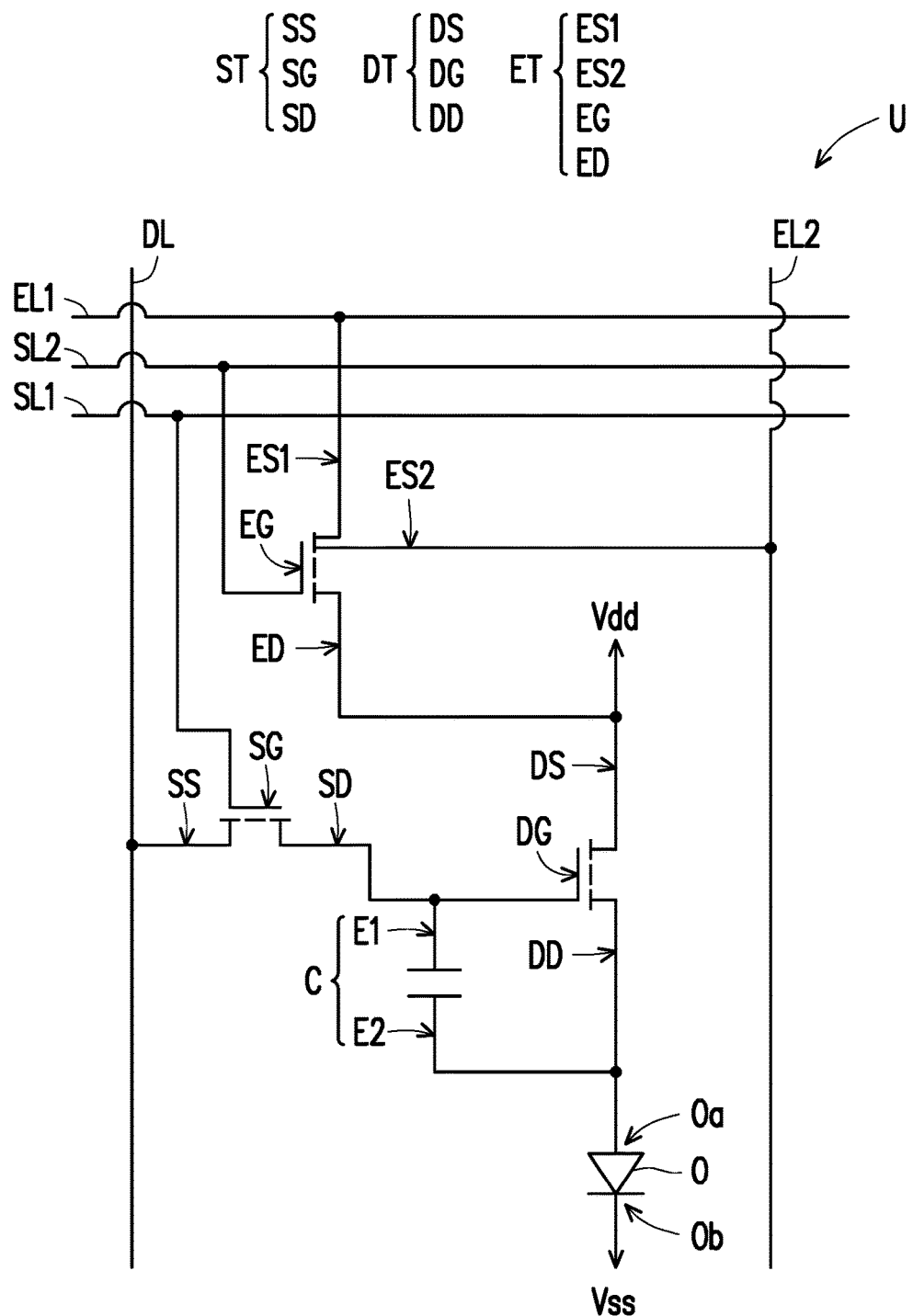
FIG. 8 is a partial equivalent circuit diagram of a sensing display panel according to another embodiment of the invention.

FIG. 8 is a partial equivalent circuit diagram of a sensing display panel according to another embodiment of the invention. Referring to both FIG. 8 and FIG. 1, a sensing display panel 40 of FIG. 8 is similar to the sensing display panel 10 of FIG. 1, and therefore the same or similar elements are represented by the same or similar reference numerals, and the same technical content is omitted. Descriptions of the omitted portions are provided in the above embodiments. In the following, the differences between the two are described.

Referring to FIG. 8, in the present embodiment, a pixel unit U of the sensing display panel 40 further includes a second scan line SL2 different from a first scan line SL1. In the present embodiment, a gate SG of a switch element ST is electrically connected to the first scan line SL1, and a gate EG of a sensing element ET is electrically connected to the second scan line SL2.

Based on the above, in the sensing display panel of the embodiments above, the pixel unit includes the switch element electrically connected to the first scan line and the data line, the driving element electrically connected to the switch element, and the sensing element electrically connected to the driving element, the first sensing line, and the second sensing line, wherein the sensing element includes the active layer, the first source, the second source, the drain, and the gate, the active layer includes the first source region electrically connected to the first source, the second source region electrically connected to the second source, the drain region electrically connected to the drain, and the channel region, the first drain is extended toward the channel region in the first direction, the second source is extended toward the channel region in the second direction, the first direction and the second direction are intersected with the normal direction of the substrate, and the angle not equal to 180 degrees is between the first direction and the second direction, and therefore two currents with different paths pass through the sensing element, and the sensing display panel has increased carrier collection rate as a result. As such, when the sensing display panel is applied in touch sensing and bend sensing, the sensing display panel may have increased sensitivity, and when the sensing display panel is applied in bend sensing, the sensing display panel may perform a sensing operation on the bending in a plurality of directions (such as the first direction and the second direction) via the current variation generated by the deformation of the sensing element.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A sensing display panel, comprising at least one pixel unit, the pixel unit comprising:
   a first scan line, a data line, a first sensing line, and a second sensing line disposed on a substrate;
   a switch element electrically connected to the first scan line and the data line;
   a driving element electrically connected to the switch element; and
   a sensing element electrically connected to the driving element, the first sensing line, and the second sensing line, the sensing element comprising:
     an active layer disposed on the substrate, wherein the active layer comprises a first source region, a second source region, a drain region, and a channel region;
     a first source electrically connected to the first source region;
     a second source electrically connected to the second source region;
     a drain electrically connected to the drain region; and
     a gate overlapped with the channel region in a normal direction of the substrate,
   wherein the first source is extended toward the channel region in a first direction, the second source is extended toward the channel region in a second direction, the first direction and the second direction are intersected with the normal direction, and an angle is between the first direction and the second direction, and the angle is not equal to 180 degrees.

2. The sensing display panel of claim 1, wherein the angle is equal to 90 degrees.

3. The sensing display panel of claim 1, wherein a contour of the active layer is T-shaped.

4. The sensing display panel of claim 1, wherein a contour of the active layer is Y-shaped.

5. The sensing display panel of claim 1, wherein the first source is electrically connected to the first sensing line, the second source is electrically connected to the second sensing line, and the drain is electrically connected to the driving element.

6. The sensing display panel of claim 1, wherein the gate is electrically connected to the first scan line.

7. The sensing display panel of claim 1, further comprising a second scan line, wherein the gate is electrically connected to the second scan line.

8. The sensing display panel of claim 7, wherein the first source is electrically connected to the first sensing line, the second source is electrically connected to the second sensing line, and the drain is electrically connected to the driving element.

9. The sensing display panel of claim 1, further comprising:
   a capacitor electrically connected to the switch element and the driving element; and
   a light-emitting element electrically connected to the driving element, wherein the angle is not equal to 90 degrees.

* * * * *